United States Patent [19]

Girard

[11] 4,344,131

[45] Aug. 10, 1982

[54] DEVICE FOR REDUCING THE TIME OF ACCESS TO INFORMATION CONTAINED IN A MEMORY OF AN INFORMATION PROCESSING SYSTEM

[75] Inventor: Paul Girard, Versailles, France

[73] Assignee: Compagnie Internationale pour l' Informatique CII-Honeywell Bull (Societe Anonyme), Paris, France

[21] Appl. No.: 100,856

[22] Filed: Dec. 6, 1979

[30] Foreign Application Priority Data

Dec. 6, 1978 [FR] France ............................ 78 34414

[51] Int. Cl.³ .............................................. G06F 3/00
[52] U.S. Cl. ..................................................... 364/200
[58] Field of Search ... 364/200 MS File, 900 MS File; 365/73, 74, 75, 76, 77

[56] References Cited

U.S. PATENT DOCUMENTS

| | | | |
|---|---|---|---|
| 3,328,566 | 6/1967 | Kinzie et al. ........................ | 364/200 |
| 3,428,951 | 2/1969 | Lindell ................................ | 364/200 |
| 3,492,658 | 1/1970 | Klett ................................... | 364/200 |
| 3,571,808 | 2/1971 | Washizuka et al. ................. | 364/200 |
| 3,801,965 | 4/1974 | Berger et al. . | |
| 3,848,232 | 11/1974 | Leibler et al. ...................... | 364/200 |
| 4,012,721 | 3/1977 | Lindsay ............................... | 364/900 |

Primary Examiner—Gareth D. Shaw
Assistant Examiner—Thomas M. Heckler
Attorney, Agent, or Firm—Edward J. Kondracki

[57] ABSTRACT

A circuit arrangement for reducing access time to information contained in a memory system that includes a register for collecting the information contained in the memory system. The register operates as a flip-flop and is composed of a first inverter, an AND gate and a second inverter. The input of the first inverter is connected to receive the information bits read in a memory block. The AND gate includes two inputs, one of which is connected to the output of the first inverter. The other input receives, at the beginning of the memory reading cycle, an initialization signal for positioning the flip-flop in a given state. The output of the AND gate is connected to the second inverter which has its output connected, in turn, to the input receiving information read from the memory system.

2 Claims, 3 Drawing Figures

DEVICE FOR REDUCING THE TIME OF ACCESS TO INFORMATION CONTAINED IN A MEMORY OF AN INFORMATION PROCESSING SYSTEM

BACKGROUND OF THE INVENTION

1. Field of the Invention

The invention relates to information processing techniques. More particularly, it relates to a circuit or device which steps in at the level of reading devices of memory systems, whether central working memories or microprogrammed control memories of computer are concerned, to reduce access time to information contained in the memory system.

2. Description of the Prior Art

The set of operations necessary for extracting an item of information from a memory system takes place sequentially in time and forms part of what is called the "reading cycle" of the memory system. The accepted technique for collecting information issuing from a memory group or assembly utilizes a register located at the output of the memory group. This register, known as a data or an instruction register, is either of the clock-equipped or locking type. In the first case, the input information issuing from the memory system enters the register in response to the appearance of a clock signal. In the second case, the input information of the register passes through it and is frozen in the logical state that it presents at the instant when a locking command signal is rendered operative.

One of the more important parameters which characterizes the performance of a memory system is its access time. This is the time which elapses between the presentation to the memory group of the so-called addressing signals which define the memory zone consulted and the information signals issuing from this storage or memory group being made available to the processor. In the usual arrangement, however, this access time is manifestly affected by the presence of an output register, called the information register, designed to collect the output signals of the memory group. In face, the output signals are fleeting in comparison with the duration of use generally required by the processor. Either the storage devices naturally offer signals of limited duration, or else their maintenance is subject to the control of a command signal the duration of which is itself limited either for technological reasons or in order to link up other operations more rapidly.

The object of the invention is therefore to reduce the access time and, consequently, improve it by taking the information register out of the chain of elements arranged in cascade between the addressing signals at the input of the memory system of an information processing system and the information signals derived at the output of the memory system.

SUMMARY OF THE INVENTION

In order to achieve this object, the device or circuit according to the invention for reducing the access time to the information contained in a memory system is characterized in that it comprises a register with a plurality of flip-flops for collecting the information contained in the memory system. Each flip-flop has at least one output and two inputs, with the output being connected to the input receiving the information read from the memory system. The other input receives, at the beginning of the memory reading cycle, an initialization signal for positioning the flip-flop in a given state.

BRIEF DESCRIPTION OF THE DRAWINGS

The invention will be better understood with the aid of the following description and the accompanying drawings, in which.

DESCRIPTION OF THE PREFERRED EMBODIMENTS

Figure 1:
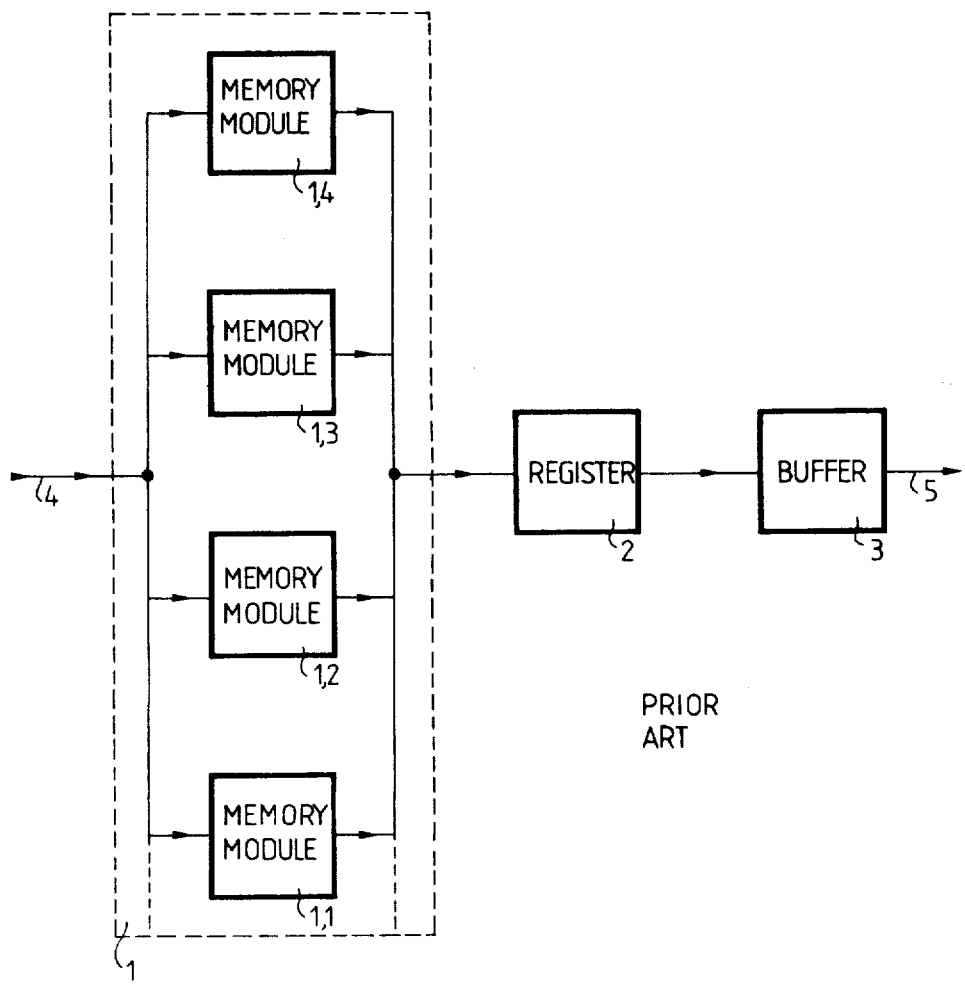
FIG. 1 is a representation of a conventional arrangement of memory systems.

In a conventional arrangement such as that shown in FIG. 1, the information contained in a group of memories such as 1 each made up of a plurality of memory blocks 1.1, 1.2, 1.3, 1.4, to be addressed in accordance with addressing and command signals 4, in a conventional manner. The information is then passed to an information register 2. The information register 2 can then be connected to a buffer or other suitable device 3 for transmitting the information contained in the register 2.

Figure 2:
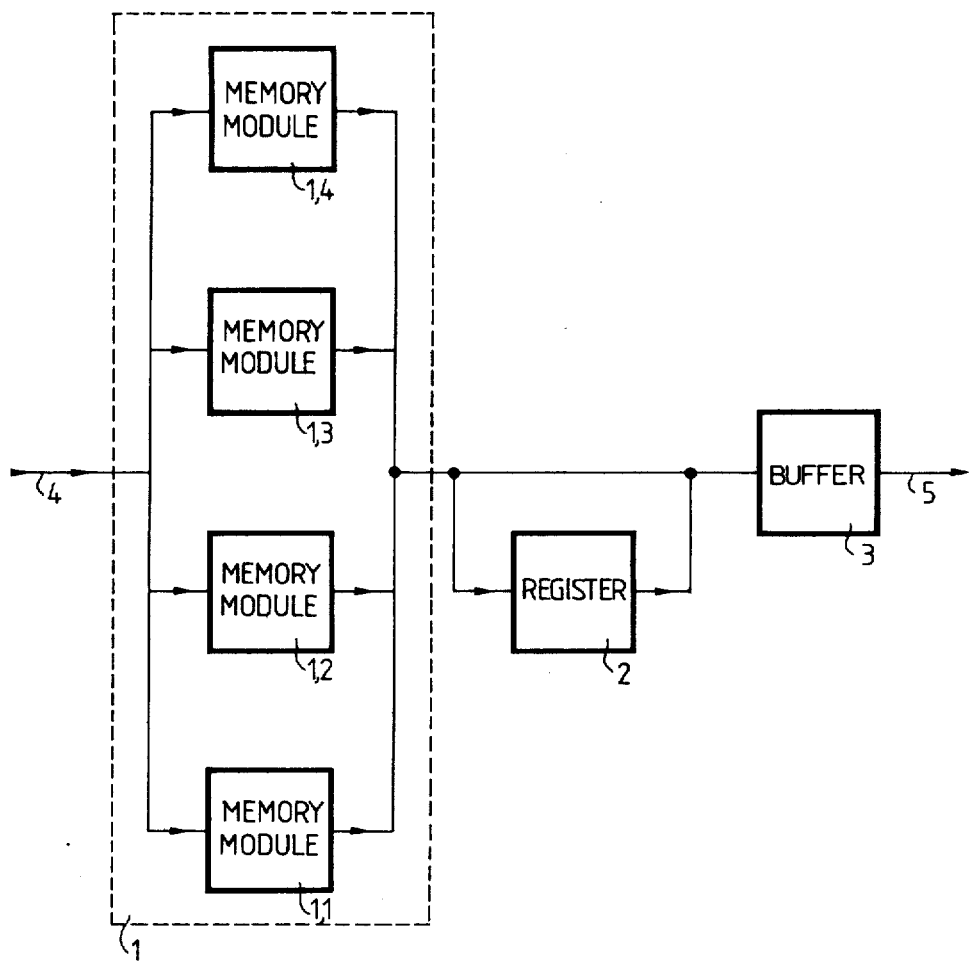
FIG. 2 shows an arrangement of a memory system incorporating the device of the invention.

In this arrangement, access to the information finally takes place in the information register 2 and, consequently, the performance of the memory system is penalized by the time of transfer of the information from the group of memories 1 to the information register 2. Consequently, as should be apparent in FIG. 2, the principle of the invention consists in coupling the input and the output of the information register 2 by a single connection which will enable the input and the output of the register 2 and the output of the group of memories to communicate at one and the same time with the input of the transmitting device 3. The transmitting device is not necessary if the use of the information signals is not effected remotely from the memory system. The necessity or not for the transmitting device is dependent upon the information processing system and technology employed as a function of the distance through which the information signals must pass.

Figure 3:
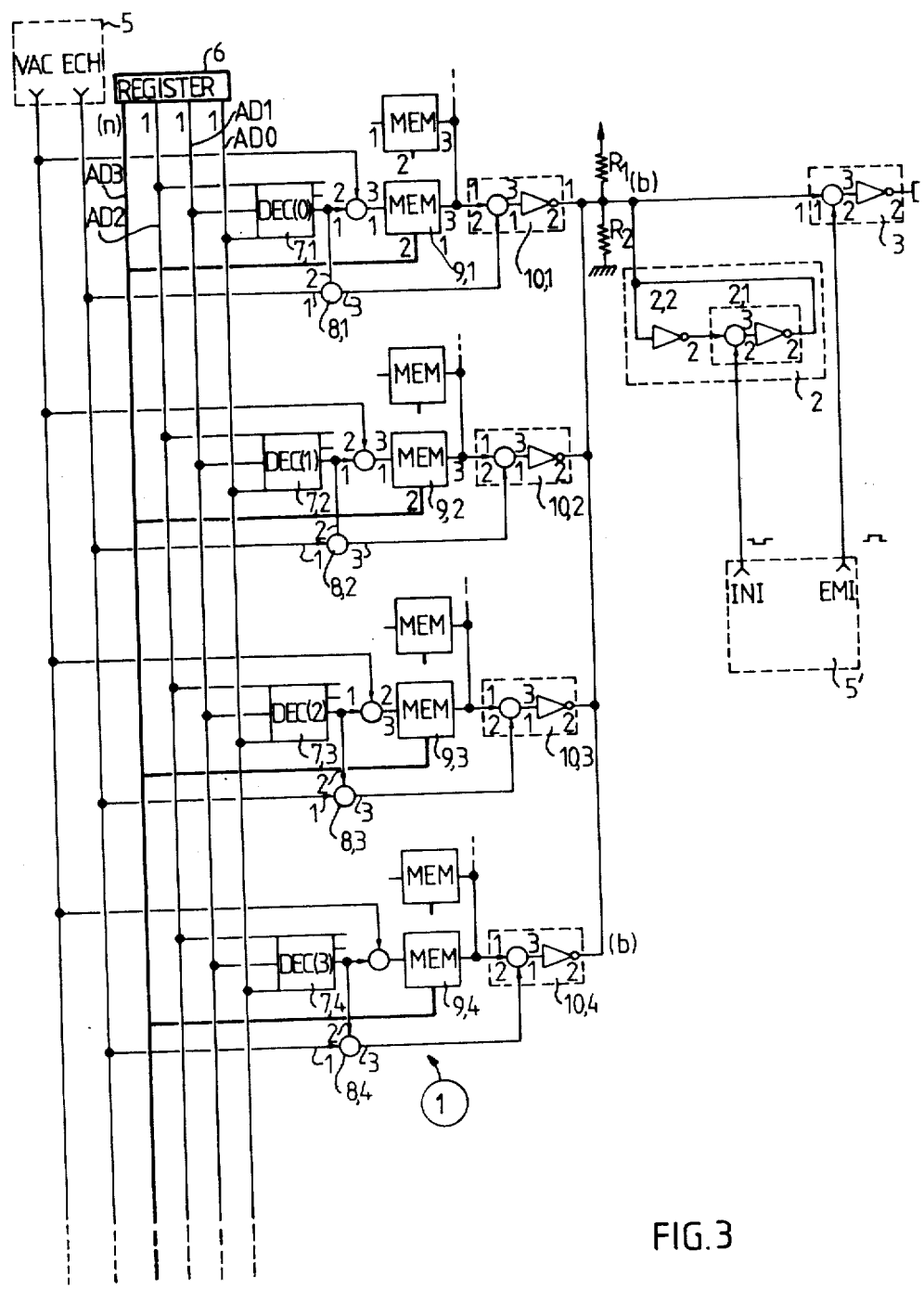
FIG. 3 is a detailed representation of a memory system incorporating the device according to the invention for reducing the time of access to the memory.

FIG. 3 is a detailed representation of a memory system incorporating the device according to the invention for reducing the time of access to the memory. Referring to FIG. 3, there is illustrated a control unit represented in dash line rectangle at 5 and 5' which supply the command signals VAC, ECH, INI and EMI which will activate the system. As has already been made clear hereinbefore, a "reading cycle" is the set of operations which enable the information to be extracted from the memory system and to be presented during the required time to the processor. At the beginning of the reading cycle, the addressing signals AD0, AD1, AD2, AD3 to ADn are presented to the memory system by the address register 6. Some of them, AD3 to ADn, access directly the memory circuits marked "MEM" and select a given cell within these circuits. The others, AD0, AD1, AD2, act on decoders marked "DEC". The appropriate output of these decoders, which is different for each memory circuit, conditions the memory circuit validation signal "VAC" issuing from the control unit after stabilization of the addressing signals. This signal "VAC" causes the selected memory circuit to deliver an information signal at its output 3 after a time adapted to this circuit.

At the begining of a memory cycle, substantially at the same time as the command signal "VAC", the initialization signal "INI", which will consequently be at "logical one" in the inoperative state and at zero in the operative state, issues from the zone of the control unit in the form of a pulse calibrated in duration at logical zero value. This pulse presents this zero value at the input 2 of the NAND element 2,1 of the information register 2. Whatever the value of the input 1, this logical zero value is imposed on the AND circuit and delivers the logical one value, after inversion by the NOT circuit of the elements 2, 1, at the output 2 of this inverter. The logical value of the output signal appears on the wire (b) coupling the various elements of the group of memories. At this instant, the sampling command signal "ECH" is inoperative, that is to say it is at logical zero level. This level is propagated through the AND circuits 8,1 8,2, 8,3, 8,4, etc. and then through the AND circuits of the NAND logic elements marked 10,1, 10,2, 10,3, 10,4, etc. to give the true logical level (one) on the wire (b) after inversion in the inverter of these elements. The "one" level which is consequently assumed by the wire (b) gives the zero level at the output 2 of the inverter 2,2 of the information register 2. This zero level therefore confirms the "zero" state on the AND circuit and thus the "one" value at the output on the wire (b) of the information register. In this way, initialization of the information register at the logical one value has been carried out. In fact, if its value were zero, giving logical "one" at the input 1 of the AND circuit of the element 2,1, the initialization command $\overline{INI}$ would have imposed its "zero" value, which, as has been seen, will be maintained at this element after feedback by the inverter 2,2, thus maintaining the value "one" as output on the wire (b) of the information register. Thus, register 2 takes the form of a flip-flop made up of a first inverter 2.2 having its input 1 connected to line (b), a two input AND gate having its input 1 connected to output 2 of the first inverter and input 2 connected to receive an initialization signal INI from controller 5' and a second inverter having its input connected to the output of the AND gate and its output 2 connected to line (b). As will be apparent, the serial AND and inverter correspond to the aforenoted NAND element 2.1 shown in the dash-line rectangle within the larger dash line rectangle 2.

The elements 2,1, 10,1, 10,2, etc. are standard circuits with open collectors, which require the presence of resistance network R1, R2 on the wire (b) connected to a suitable power supply. The group of logical signals supplying the wire (b) functions as a wired AND, i.e. when only one of them is at the logical "zero" value, the zero value is imposed on the wire (b).

Four memory subassemblies comprising a decoder "DEC" 7,1 to 7,4, one or more memory circuits "MEM" 9,1 to 9,4 and their associated logic elements are shown in FIG. 3. It is possible to connect a plurality of subassemblies of this type to the wire (b). Each subassembly will then be selected by the decoder "DEC". With the aid of a supplementary array of decoders not shown in FIG. 3, it will also be possible to connect a plurality of memory circuits to the input 1 of the AND element of the gates 10,1 to 10,4. The circuit validation signal "VAC" emitted by the control unit 5 is conditioned by the decoders "DEC" so that a single memory circuit "MEM" can supply an output value. At the instant when the selected memory circuit "MEM" delivers its information signal at its output 3, the sampling command signal "ECH" emitted by the control unit 5 is rendered operative, that is to say it is put to logical 1 value. It appears at the input 1 of the AND circuit 8,1, 8,2, etc. alone. The AND circuit which receives from the corresponding decoder "DEC" a validation at "one" at its input 2 delivers a command signal at its output 3. This command signal at the input of the AND circuit of the element 10 validates the information signal entering at 1 and issuing from the selected memory circuit "MEM". The memory circuits "MEM" contain the complemented logical value. If the value issuing from the memory block "MEM" is "zero", corresponding to an item of information at the logical "one" value, this zero is imposed on the AND circuit of the corresponding element 10 and is transformed, after inversion, into the logical "one" value on the wire (b). The information register 2 is not altered and this value is immediately available at the input 1 of the transmitting NAND element marked 3. Accordingly and advantageously, the time of passage through the information register has been improved so as to reduce the access time by the same amount. This information is obviously preserved after the end of the sampling. If, on the other hand, the value issuing from the memory block "MEM" is at "one", corresponding to an item of information at the logical "zero" value, the output 3 of the AND circuit of the corresponding element 10 assumes the value "one" during the duration of the sampling signal. This imposes the value "zero" as output of the said element 10 and, consequently, on the wire (b).

Here again information is immediately available on the wire (b) without passing through the information register, which receives this same "zero" value in parallel on the input 1 of its inverter 2,2. After inversion due to this inverter, the "one" value appears at the input 1 of the AND circuit of the element 2,1. As the initialization command signal $\overline{INI}$ is inoperative, that is to say at the logical "one" value, the output 3 of the AND circuit of the element 2,1 assumes the "one" value, confirming after inversion by the inverter of the circuit 2,1 the "zero" value on the wire (b). This value is preserved by the feedback through the inverter 2,2 and the circuit 2,1 of the information register 2. After disappearance of the sampling signal "ECH", the information register 2 ensures the "zero" value on the wire (b). As in the preceding case, the time of passage through the information register has likewise been avoided.

The example of a preferred embodiment of the invention which has just been given is by no means limitive. It is quite obvious that other embodiments may suggest themselves to those skilled in the art and acquainted with information processing techniques without thereby departing from the true spirit and scope of the invention as defined in the appended claims and it is intended by these claims to cover all such embodiments.

I claim:

1. A circuit arrangement for reducing access time to information contained in a memory system of an information processing system, wherein the said memory system includes at least a memory block capable of containing a plurality of information bits and having associated therewith means for reading the information bits contained in said memory block, the improvement comprising a register connected to successively receive each information bit read from said memory block said register having at least one output and two inputs, the said output being connected to the input of the register receiving each information bit read by reading means and the other input being connected to receive at the beginning of the reading cycle of said memory block an initialization signal enabling said output into a predetermined state, said circuit arrangement being such that each information bit read by the reading means is directly available at the output of the said reading means without passing through said register.

2. A circuit arrangement for reducing the time of access to information contained in a memory system of an information processing system wherein the said memory system includes at least a memory block capable of containing a plurality of information bits and having associated therewith means for reading the information bits contained in said memory block, the improvement comprising a register connected to successively receive each information bit read from said memory block and having flip-flop means for storing each information bit read by the reading means, said flip-flop means being composed of a first inverter having an input connected to receive each information bit read in said memory block corresponding thereto, an output connected to one input of a two input AND gate, the second input of each AND gate being connected to receive an initialization signal, and a second inverter, said AND gate having its output connected to the input of said second inverter, the output of said second inverter being connected to the input of the first inverter.

* * * * *